US012741657B2

(12) United States Patent
Subramanian

(10) Patent No.: US 12,741,657 B2
(45) Date of Patent: Sep. 22, 2026

(54) METHOD FOR MONITORING HEALTH STATUS OF A CHASSIS SYSTEM OF A VEHICLE

(71) Applicant: Volvo Truck Corporation, Gothenburg (SE)

(72) Inventor: Chidambaram Subramanian, Greensboro, NC (US)

(73) Assignee: Volvo Truck Corporation, Gothenburg (SE)

( * ) Notice: Subject to any disclaimer, the term of this patent is extended or adjusted under 35 U.S.C. 154(b) by 994 days.

(21) Appl. No.: 17/979,889

(22) Filed: Nov. 3, 2022

(65) Prior Publication Data

US 2023/0150520 A1 May 18, 2023

(30) Foreign Application Priority Data

Nov. 15, 2021 (EP) .................................... 21208207

(51) Int. Cl.
*B60W 50/02* (2012.01)
*G06F 30/20* (2020.01)
*G07C 5/08* (2006.01)

(52) U.S. Cl.
CPC ......... *B60W 50/0225* (2013.01); *G06F 30/20* (2020.01); *G07C 5/0808* (2013.01)

(58) Field of Classification Search
CPC .... G06F 30/00; G06F 30/20; B60W 50/0225; G07C 5/0808; G05B 23/0254; B60R 16/0232; B60T 17/22

(Continued)

(56) References Cited

U.S. PATENT DOCUMENTS 6,609,051 B2 8/2003 Fiechter et al.
10,789,786 B2 9/2020 Zhang et al.

(Continued)

FOREIGN PATENT DOCUMENTS

CN 112033710 A 12/2020
CN 113392572 A * 9/2021 ............ G06N 3/045
DE 102018004575 A1 11/2018

OTHER PUBLICATIONS

Intention to Grant for European Patent Application No. 21208207.7, mailed Feb. 9, 2024, 31 pages.

(Continued)

*Primary Examiner* — Cedric Johnson
(74) *Attorney, Agent, or Firm* — Withrow & Terranova, PLLC

(57) ABSTRACT

Method for monitoring health status of a chassis system of a vehicle comprising a new electronic control unit, a set of sensors, and a communication bus configured to convey signal data, the new electronic control unit being configured to run a vehicle chassis system simulation module based on a vehicle main physics-based model of each subsystem of the chassis system of the vehicle, a first neural network module, a second neural network module, and a signal processing module, comprising the following steps implemented by the new electronic control unit to predict a first set of data-driven subsystem health statuses, provide a second set of physics-based subsystem health statuses, provide a set of consolidated subsystem health statuses, and depending on the set of consolidated subsystem health statuses, produce a support recommendation to correct failures indicated by the set of consolidated subsystem health statuses.

8 Claims, 2 Drawing Sheets

(58) Field of Classification Search
USPC .......................................................... 703/8, 6
See application file for complete search history.

(56) References Cited

U.S. PATENT DOCUMENTS

| | | | | |
|---|---|---|---|---|
| 2015/0332520 | A1* | 11/2015 | Komada ............. | G01M 17/007 701/29.1 |
| 2019/0311558 | A1 | 10/2019 | Bika et al. | |
| 2019/0318051 | A1 | 10/2019 | Oswald et al. | |
| 2020/0226734 | A1 | 7/2020 | Kumar et al. | |
| 2022/0316993 | A1* | 10/2022 | Xu ...................... | G01M 17/045 |

OTHER PUBLICATIONS

Extended European Search Report for European Patent Application No. 21208207.7, mailed May 12, 2022, 5 pages.

* cited by examiner 101
collect signal data (SD)
102
process SD
100
103
feed processed SD to FNN,
feed SD to VSM
103bis
104
provide SSHS1-SSHSi, and PSSHS1-PSSHSi to SNN,
105
produce and send CSSHS1-CSSHSi to a support center
105bis
update NECUP into VSM

BM
TM
EPM
TGM
VM
VMPM=TMM
BSM
SSM
VSM

METHOD FOR MONITORING HEALTH STATUS OF A CHASSIS SYSTEM OF A VEHICLE

RELATED APPLICATIONS

This present application claims priority to European Patent Application No. 21208207.7, filed on Nov. 15, 2021, and entitled "METHOD FOR MONITORING HEALTH STATUS OF A CHASSIS SYSTEM OF A VEHICLE," which is incorporated herein by reference in its entirety.

FIELD OF THE INVENTION

This invention relates to the field of monitoring health of a chassis system of a vehicle.

BACKGROUND

It is known to monitor and control each subsystem of a chassis system of a vehicle, but there is a need for a system connecting the monitoring and the control at a complete chassis system.

SUMMARY OF THE INVENTION

To that end, the present invention provides a method for monitoring health status of a chassis system of a vehicle, the chassis system comprising a plurality of subsystems of the chassis system of the vehicle, the vehicle comprising a new electronic control unit, a set of sensors, and a communication bus configured to convey signal data to the new electronic control unit, the new electronic control unit being configured to run a vehicle chassis system simulation module based on a vehicle main physics-based model of the chassis system of the vehicle and based on a physics-based model of each subsystem of the chassis system of the vehicle, a first neural network module, a second neural network module, and a signal processing module, the method comprising the following steps implemented by the new electronic control unit:

- collect signal data, the signal data comprising measured sensor data measured by at least one sensor of the set of sensors during a period of time;
- process, by the signal processing module, the signal data, to produce processed signal data;
- feed processed signal data as input to the first neural network module, trained for predicting a first neural network output, the first neural network output comprising a first set of data-driven subsystem health statuses;
- feed the signal data as input to the vehicle chassis system simulation module, the vehicle chassis system simulation module being configured to provide a vehicle chassis system simulation output based on a physics-based model of the vehicle chassis system and on the signal data, the vehicle chassis system simulation output comprising a second set of physics-based subsystem health statuses;
- provide the first set of data-driven subsystem health statuses and the second set of physics-based subsystem health statuses as input to the second neural network, the second neural network being configured to provide a second neural network output, the second neural network output being a set of consolidated subsystem health statuses;

- depending on the set of consolidated subsystem health statuses, produce a support recommendation to temporarily correct failures indicated by the set of consolidated subsystem health statuses and send the set of consolidated subsystem health statuses to a support center to plan future support actions to permanently correct said failures.

According to an embodiment, the invention comprises one or more of the following features, alone or in any combination technically compatible.

According to an embodiment, the signal data collected at step of collecting signal data further comprises new model parameters transmitted via the communication bus as signals from at least one other electronic control unit installed on the chassis system and on the subsystems of the chassis system of the vehicle.

According to an embodiment, the new electronic control unit is provided with new electronic control unit parameters, comprising configurable parameters embedded inside the new electronic control unit, which are entered into the physics-based vehicle chassis system simulation module, either in the vehicle main physics-based model of the chassis system of the vehicle and/or in the physics-based model of anyone of the subsystem of the chassis system of the vehicle, the method, and wherein the at least one other electronic control unit is provided with other electronic control unit parameters comprising configurable parameters embedded inside the other electronic control unit comprising configurable parameters embedded inside the new electronic control unit, further comprising the following step:

- update at least one of the new electronic control unit parameters into the vehicle chassis system simulation module, to update the physics-based model of the vehicle chassis system simulation module, and/or update via the communication bus at least one of the other electronic control unit parameters based on predictions of the second neural network.

According to an embodiment, the set of sensors comprises all the sensors installed on the chassis system and on the subsystems of the chassis system of the vehicle.

According to an embodiment, the set of sensors comprises at least one of a brake pedal position sensor, a throttle pedal position sensor, a steering angle sensor, a wheel speed sensor, a vehicle speed sensor, a vehicle accelerometer, a temperature sensor, a pressure sensor.

According to an embodiment, measured sensor data measured by at least one sensor of the set of sensors comprise any physical data which can be measured on any part of each subsystem of the chassis system of the vehicle, such as a wheel speed, a vehicle speed, a temperature, a pressure, a vehicle acceleration, a steering angle, a throttle pedal position, a brake pedal position.

According to these provisions, the more sensors are used, the more accurate will the predictions be.

According to an embodiment, the new model parameters comprise any high frequency changing parameter that is used in another electronic unit, a high frequency changing parameter being a parameter the value of which changes within less than one second of time, or within less than 25 meters of vehicle travelling.

According to an embodiment, the new model parameters comprise parameters related to any components of a brake system, the components comprising for example the brake pedal, with related new model parameters such as stiffness and orifice, and/or an electronic valve of the brake system, with related new model parameters such as a solenoid spring stiffness, PID gains, valve piston friction and mass, and/or a chamber brake with related new model parameters such as a pad wear or thickness, a chamber spring stiffness, and/or a calliper with related new model parameters such as a pivot arm, a gear mesh and friction, and/or a friction pad, with related new model parameters such as a friction coefficient, and/or a rotor with related new model parameters such as temperature and effective radius.

According to an embodiment, the new model parameters comprise parameters related to any components of the transmission system, the components comprising for example the throttle with related new model parameters such as a stiffness, the components comprising for example the engine with related new model parameters such as an engine map, an engine efficiency, a friction, and PID gains, the components comprising for example the clutch with related new model parameters such as a friction coefficient, the components comprising for example the torque converter with related new model parameters such as an efficiency and angles, the components comprising for example the gear with related new model parameters such as an efficiency, and gear ratios, with PID gains, the components comprising for example a propeller shaft with related new model parameters such as an inertia, the components comprising for example the differential with related new model parameters such as an inertia and friction values with gear ratios, the components comprising for example the drive shaft with related new model parameters such as an inertia.

According to an embodiment, the new model parameters comprise parameters related to any components of a suspension system, the components comprising for example a leaf spring or an airbag with related new model parameters such as a stiffness, the components comprising for example a shock absorber or a damper with related new model parameters such as a damping, the components comprising for example the control arms flexibility with related new model parameters such as a stiffness, the components comprising for example the wheel kinematics (jounce and rebound) with related new model parameters such as an kinematic links, the components comprising for example a torsion bar with related new model parameters such as friction, the components comprising for example electronically controlled suspension valves with related new model parameters such as solenoid spring stiffness, PID gains, valve piston friction and mass.

According to an embodiment, the new model parameters comprise parameters related to any components of a steering system, the components comprising for example tie rod or track rod, a steering compliance bushings, a steering gear, a steering column, a dynamic steering controller, a dynamic steering motor with related new model parameters such geometry and compliances.

According to an embodiment, the step of processing, by the signal processing module, the signal data, comprises removing the noise from the signal data, and/or converting the signal data in a frequency domain, such as using a Fourier transformation of the data signal.

According to an embodiment, the vehicle chassis system simulation module comprises a truck main model corresponding to the vehicle main physics-based model, and further comprises a tires model, an engine and powertrain model, a valves model, a suspension and steering model, a brakes model, a truck geometry model, a brake system model, corresponding to the physics-based model of each subsystem of the chassis system of the vehicle.

According to an embodiment, the physics-based model of each subsystem of the chassis system of the vehicle also comprises the physical model of one or more components of respectively the tires model, the engine and powertrain model, the valves model, the suspension and steering model, the brakes model, the truck geometry model, the brake system model, such as a chamber model, calliper of brakes model, a clutch model, an gearbox model, propulsion shaft model, a differential model, a wheels model, suspension springs and dampers model, air suspension chamber model, etc. . . .

According to an aspect, the invention provides a computer program comprising a set of instructions executable on a computer or a processing unit, the set of instructions being configured to implement the method according to anyone of the embodiments described herein above, when the instructions are executed by the computer or the processing unit.

According to another aspect, the invention provides a new electronic control unit configured to communicate with a communication bus of a vehicle so as to collect signal data time series during a period of time, the signal data comprising measured sensor data measured during the period of time by at least one sensor of a set of sensors installed on a chassis system and on subsystems of the chassis system of the vehicle, the signal data further comprising new model parameters transmitted via the communication bus as signals from at least one other electronic control unit installed on the chassis system and on the subsystems of the chassis system of the vehicle, the new electronic control unit being configured to run a vehicle chassis system simulation module based on a vehicle main physics-based model of the chassis system of the vehicle and on a physics-based model of each subsystem of the chassis system of the vehicle, the new electronic control unit being further configured to run a first neural network module, the first neural network being preferably a recurrent neural network, the new electronic control unit being further configured to run a second neural network module, and a signal processing module, the new electronic control unit further comprising a processing unit and a memory unit, the memory unit comprising a computer program as set forth herein above.

According to another aspect, the invention provides a vehicle comprising a new electronic control unit as set forth herein above.

BRIEF DESCRIPTION OF THE DRAWINGS

The foregoing and other purposes, features, aspects and advantages of the invention will become apparent from the following detailed description of embodiments, given by way of illustration and not limitation with reference to the accompanying drawings, in which the same reference refer to similar elements or to elements having similar functions, and in which.

DETAILED DESCRIPTION

The method 100 according to an embodiment of the invention is directed towards monitoring the health status of a vehicle chassis system.

The chassis system comprises a plurality of subsystems. The vehicle comprises a new electronic control unit NECU according to the invention, the new electronic control unit NECU being configured to run a vehicle chassis system simulation module VSM; the vehicle chassis system simulation module VSM is based on a vehicle main physics-based model VMPM of the chassis system of the vehicle and on a physics-based model VSSPM1, VSSPM2, . . . , VSSPMi, . . . of each subsystem of the chassis system of the vehicle.

Figure 1:
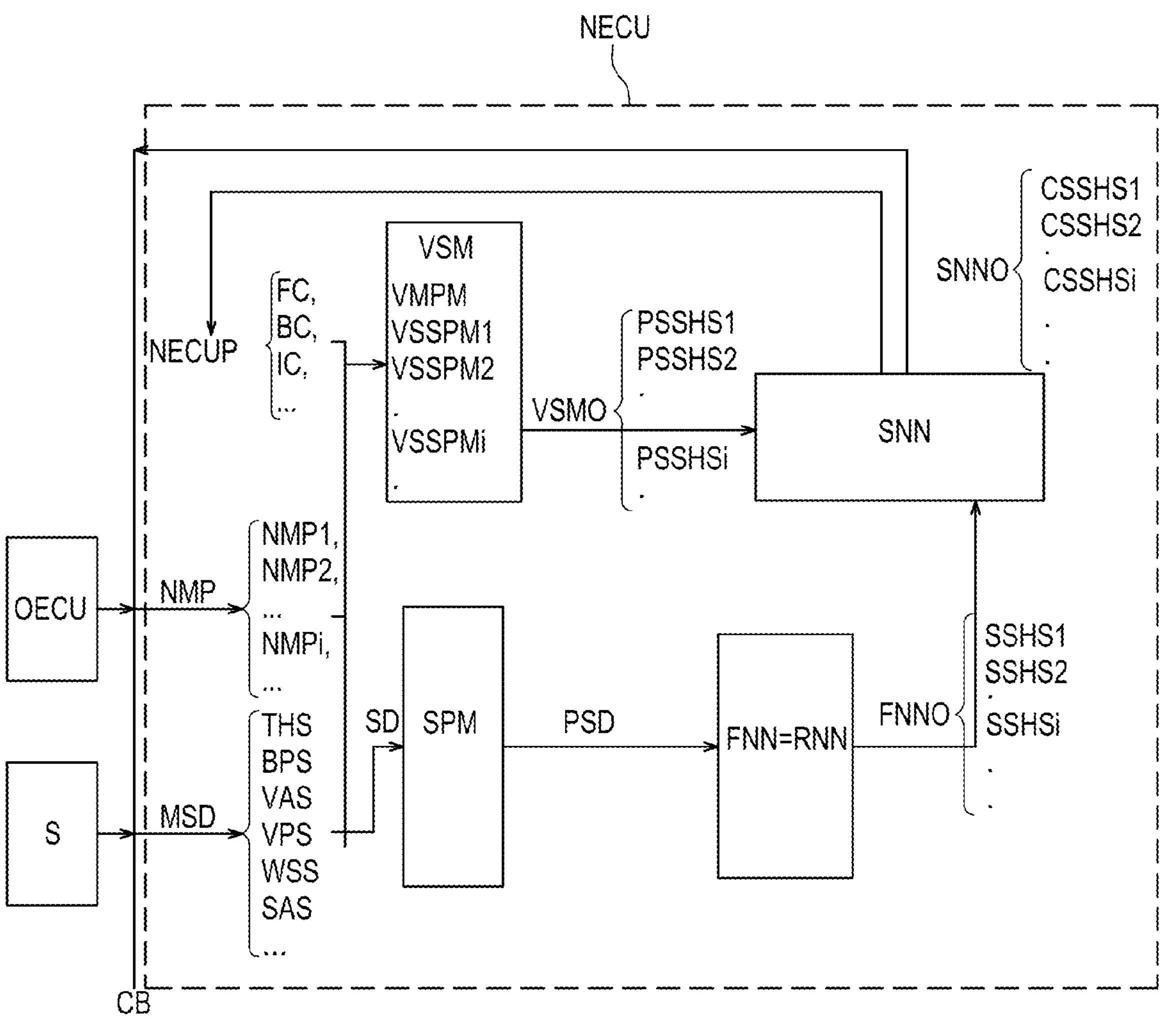
FIG. 1 represents schematically the main components of a vehicle involved in the implementation of the method according to an embodiment of the invention.
Figure 2:
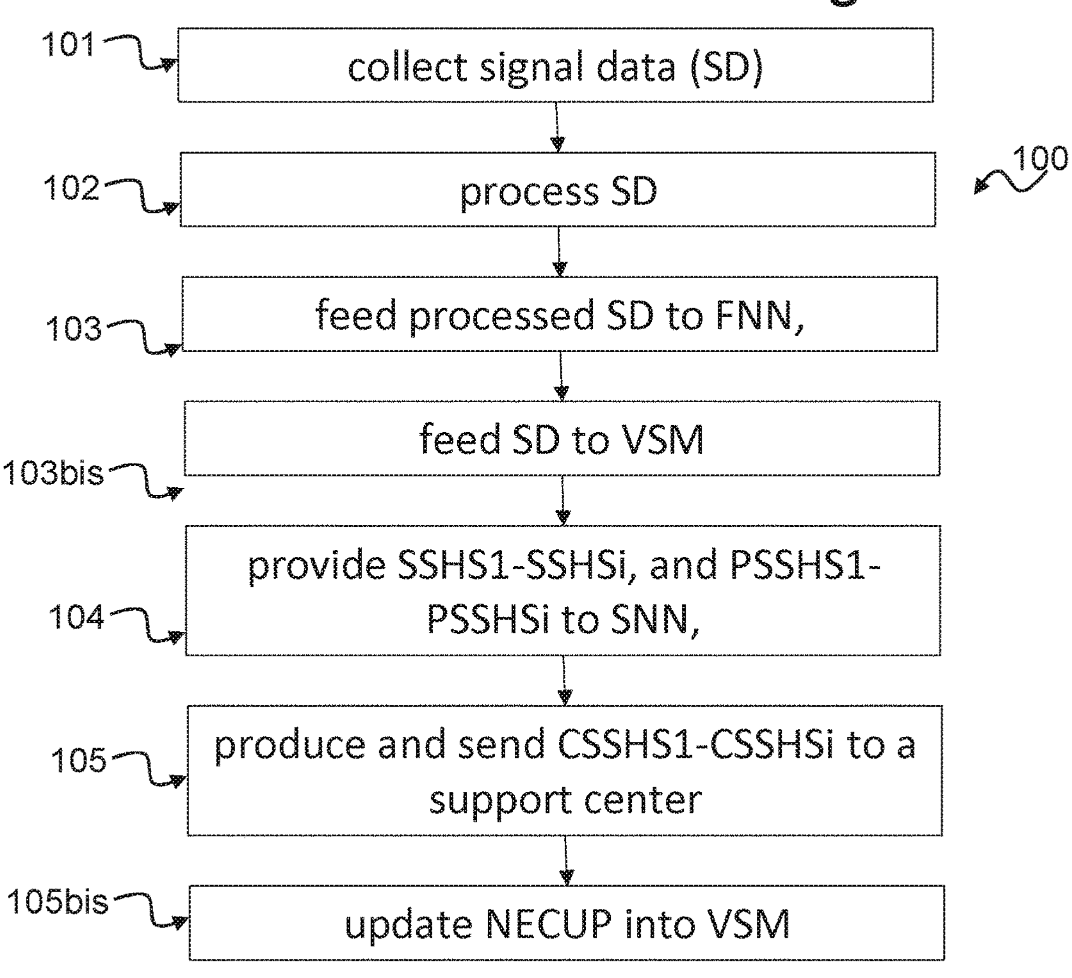
FIG. 2 represents the sequence diagram of the steps of the method according to an embodiment of the invention.
Figure 3:
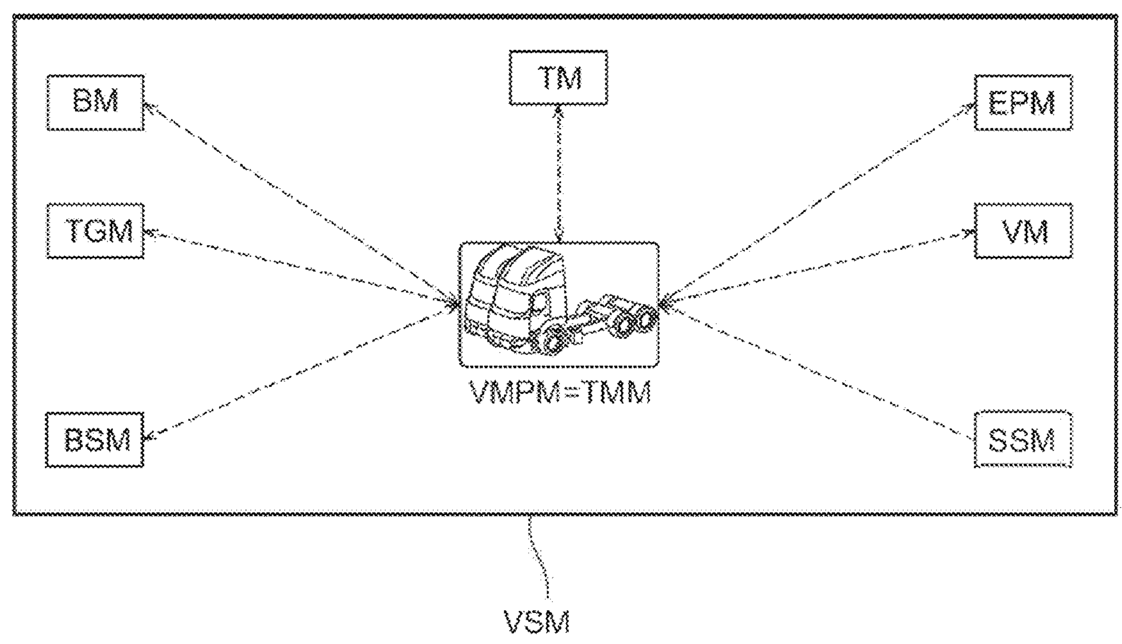
FIG. 3 represents schematically the main components of the vehicle chassis system simulation module.

For example, as illustrated on FIG. 3, the vehicle chassis system simulation module VSM may comprise a truck main model TMM corresponding to the vehicle main physical model VMPM, and may further comprise a tires model TM, an engine and powertrain model EPM, a valves model VM, a suspension and steering model SSM, a brakes model BM, a truck geometry model TGM, a brake system ECU model BSM, each one of these models corresponding to the physics-based model VSSPM1, VSSPM2, . . . , VSSPMi, . . . of one of the subsystems of the chassis system of the vehicle.

More specifically, the physics-based model VSSPM1, VSSPM2, . . . , VSSPMi, . . . of each subsystem of the chassis system of the vehicle also comprises the physics based model of one or more components of respectively the tires model TM, the engine and powertrain model EPM, the valves model VM, the suspension and steering model SSM, the brakes model BM, the truck geometry model TGM, the brake system ECU model BSM.

For example, concerning the brakes model, the components of the brakes model may be a brake pedal model, an electronic valve model, a chamber brake model, a calliper model, a friction pad model and a rotor model.

Similarly, concerning the throttle and clutch system, the components may be a throttle, an engine, a clutch, a torque converter, an gearbox, a propeller shaft, a differential, a drive shaft.

Concerning the suspension, the components may be a leaf spring or an airbag, a shock absorber or a damper, arms flexibility controlling means, wheel kinematics controlling means, such as jounce and rebound, a torsion bar, one or more electronically controlled suspension valves, a tic rod or a track rod, steering compliance bushings, steering gear, steering column, dynamic steering controller, dynamic steering motor.

Other electronic control units OECU are installed on the chassis system, in particular on the subsystems of the chassis system of the vehicle to control said subsystems, based on other electronic control units OECU parameters. These other electronic control units OECU parameters are for example embedded variables in the code and are configurable using external tool for tuning the control system.

For example, the other electronic control unit OECU may have parameters like final drive line gear ratio or tire radius. These parameters are used in the other electronic control unit OECU for estimating the right amount of torque to be transferred, the torque required being a function of tire radius and final drive line ratio. In this example, tire radius parameter changes over time. It may be updated automatically either through other electronic control units OECUs or manually by the customer during a service at workshop. The final driveline ratio is never be updated unless the gear is replaced with a new different gear ratio. These updates are very less frequent.

The vehicle further comprises a communication bus CB configured to electronically convey data shared between all electronic control units, which includes the new electronic control unit NECU and other electronic control unit OECU. The communication bus CB may be, for example, a controller area network, or popularly known as CAN BUS, which is a secure communication protocol between multiple other electronic control units OECU in modern vehicles. Each other electronic control unit OECU is connected to some sensors which is used in the control algorithm that resides in that ECU. Few sensor data must be shared between other electronic control unit OECUs, which happens via the communication bus CB. These sensor data that needs to be shared between multiple other electronic control unit OECUs or within the same ECU are called signals and not parameters. A parameter could also be transferred as a signal if needed. But a signal is not a parameter.

Thus the data conveyed by the communication bus may be measured signal data MSD, measured by sensors from a set of sensors S provided with the vehicle, associated with and shared by other electronic control units OECU, the sensors being installed on the chassis system and on the subsystems of the chassis system of the vehicle.

The measured signal data MSD according to the invention may for example be such as a speed, a temperature, a pressure, a throttle, etc. . . .

More specifically, the set of sensors S may comprise one or more of a brake pedal position sensor BPS, a throttle pedal position sensor THS, a steering angle sensor SAS, a wheel speed sensor WSS, an vehicle accelerometer VAS, etc.

Even more specifically, the set of sensors S may also comprise one or more of other sensor related to the brake system, such as the brake pedal position sensor BPS, a control pressure sensor, a delivery pressure sensor, a wheel speed sensor, a wheel torque sensor, a stroke length sensor, a brake temperature sensor, etc. . . .

The set of sensors S may further comprise one or more of other sensor related to the throttle and clutch system, such as the throttle pedal position sensor THS, a throttle input sensor, a demand torque sensor, an actual torque sensor, a transmission torque sensor, a clutch state sensor, a differential state sensor, a wheel speed sensor, a shaft speed sensor, etc. . . .

The set of sensors S may further comprise one or more of other sensor related to the steering input system, such as the steering angle sensor SAS, a dynamic steering torque sensor, a wheel angle sensor, a dynamic steering input torque sensor, a ride height sensor, a pitch angle sensor, a roll angle sensor, a wheel travel sensor, a roll rate sensor, front load sensor, a rear load sensor, an inclination sensor, etc. . . .

The more sensors are used, the more accurate will be the predictions of the method.

The data conveyed by the communication bus may be new model parameters NMP transmitted as signals NMP1, NMP2, . . . , NMPi, . . . from some other electronic control unit OECU installed on the chassis system and on the subsystems of the chassis system of the vehicle.

The new model parameters NMP according to the invention may for example be PID gains, brake factor, tire radius, etc. . . . ; according to an embodiment of the invention, any high frequency changing parameter or any parameter that is used in another electronic unit OECU will be sent out as a signal from the specific other electronic unit OECU to the communication bus. According to the previous example, stiffness of a brake pedal will not be sent out, since stiffness of brake pedal will not be used anywhere apart from that parent electronic control unit, and since it is not a high frequency changing value, whereas friction pad wear will be sent out as a signal because it is changing over time more frequently than pedal stiffness and it is used in multiple other electronic control units OECU.

A high frequency changing parameter or value is a parameter or a value which may change within less than one second of time, or within less than 25 meters of vehicle travelling.

Referring now to the components of each subsystem of the chassis system, for example a brake system, the new model parameters NMP may comprise parameters related to the components of said brake system, that is respectively to the brake pedal, such as stiffness and orifice, and/or to an electronic valve of the brake system, such as a solenoid spring stiffness, PID gains, valve piston friction and mass, and/or to a chamber brake such as a pad wear or thickness, a chamber spring stiffness, and/or to a calliper such as a pivot arm, a gear mesh and friction, and/or to a friction pad, such as a friction coefficient, and/or to the rotor such as temperature and effective radius.

A similar enumeration of the parameters related to the components of the drivetrain/powertrain subsystem, and/or to the components of the steering input system may be done, which is known from the man reasonably skilled in the art.

For example, the new model parameters comprise parameters related to any components of the transmission system, the components comprising for example the throttle with related new model parameters such as a stiffness, the components comprising for example the engine with related new model parameters such as an engine map, an engine efficiency, a friction, and PID gains, the components comprising for example the clutch with related new model parameters such as a friction coefficient, the components comprising for example the torque converter with related new model parameters such as an efficiency and angles, the components comprising for example the gear with related new model parameters such as an efficiency, and gear ratios, with PID gains, the components comprising for example a propeller shaft with related new model parameters such as an inertia, the components comprising for example the differential with related new model parameters such as an inertia and friction values with gear ratios, the components comprising for example the drive shaft with related new model parameters such as an inertia.

As another example, the new model parameters comprise parameters related to any components of a suspension system, the components comprising for example a leaf spring or an airbag with related new model parameters such as a stiffness, the components comprising for example a shock absorber or a damper with related new model parameters such as a damping, the components comprising for example the control arms flexibility with related new model parameters such as a stiffness, the components comprising for example the wheel kinematics (jounce and rebound) with related new model parameters such as an kinematic links, the components comprising for example a torsion bar with related new model parameters such as friction, the components comprising for example electronically controlled suspension valves with related new model parameters such as solenoid spring stiffness, PID gains, valve piston friction and mass.

For another example, the new model parameters comprise parameters related to any components of a steering system, the components comprising for example tie rod or track rod, a steering compliance bushings, a steering gear, a steering column, a dynamic steering controller, a dynamic steering motor with related new model parameters such geometry and compliances.

The new electronic control unit NECU is provided with new electronic control unit parameters NECUP; the new electronic control unit parameters NECUP comprise configurable parameters embedded inside the new electronic control unit NECU, which are entered into the physics-based vehicle chassis system simulation module VSM, either in the vehicle main physics-based model VMPM of the chassis system of the vehicle and/or in the physics-based model VSSPM1, VSSPM2, . . . , VSSPMi, . . . of anyone of the subsystem of the chassis system of the vehicle.

The new electronic control unit NECU according to the invention is further configured to run a first neural network module FNN, a second neural network module SNN, and a signal processing module SPM.

The method 100 comprises the following steps implemented by the electronic control unit ECU:

collect 101 signal data SD, the signal data SD comprising measured sensor data MSD measured by at least one sensor from the set of sensors S during a period of time;

process 102, by the processing module SPM, the signal data SD, to produce processed signal data PSD; for example, the processing may consist in removing noise from the raw signal data time series, or in transforming in a frequency domain each signal data time series collected by the at least one sensor of the set of sensors S, thus providing as processed signal data PSD a power spectrum of one or more signal data time series during the period of time.

feed 103 processed signal data PSD as input to the first neural network module FNN, trained for predicting a first neural network output FNNO, the first neural network output FNNO comprising a first set of data-driven subsystem health statuses SSHS1, SSHS2, . . . , SSHSi, . . . ; the first set of data-driven subsystem health statuses SSHS1, SSHS2, . . . , SSHSi, . . . comprises health status concerning one or more of the different subsystems of the chassis system of the vehicle.

The first neural network FNN is advantageously a recurrent neural network RNN, more specifically configured to make predictions from signal data time series as input. Health status predicted by the recurrent neural network RNN from the input may depend on the subsystem of the component considered; it will be for example one of "good", "worn out", "broken", "wear rate", "cracked", "acceptable", "unacceptable", "modification", etc. . . .

The recurrent neural network RNN will have been extensively trained to do such predictions, based on a sets of data time series processed and input to the recurrent neural network RNN, and manually labelled according to the observed health status of the subsystem or the component considered.

The method 100 further comprises the following steps implemented by the electronic control unit ECU:

feed 103*b* is the signal data SD as input to the vehicle chassis system simulation module VSM, the vehicle chassis system simulation module VSM being configured to provide a vehicle chassis system simulation output VSMO based on the physics-based model of the vehicle chassis system and on the signal data SD, the vehicle chassis system simulation output VSMO comprising a second set of physics-based subsystem health statuses PSSHS1, PSHS2, . . . , PSSHSi, . . . ;

provide 104 the first set of subsystem health statuses SSHS1, SSHS2, . . . , SSHSi, . . . and the second set of physics-based subsystem health statuses PSSHS1, PSSHS2, . . . , PSSHSi, . . . as input to the second neural network SNN, the second neural network SNN being configured to provide a second neural network output SNNO, the second neural network output SNNO being a set of consolidated subsystem health statuses CSSHS1, CSSHS2, . . . , CSSHSi, . . . ;

depending on the set of consolidated subsystem health statuses CSSHS1, CSSHS2, . . . , CSSHSi, . . . produce 105 a support recommendation to temporarily correct failures indicated by the set of consolidated subsystem health statuses CSSHS1, CSSHS2, . . . , CSSHSi, . . . and send the set of consolidated subsystem health statuses CSSHS1, CSSHS2, . . . , CSSHSi, . . . to a support center to plan future support actions to permanently correct said failures.

The consolidated subsystem health statuses CSSHS1, CSSHS2, . . . , CSSHSi, . . . of each component are shared with all the other electronic control units OECUs and therefore that will also be sent out as a signal on the control bus CB.

Optionally, the signal data SD collected at step 101 of collecting signal data SD comprises not only measured sensor data MSD measured by at least one sensor from the set of sensors S during a period of time, but further comprises new model parameters NMP transmitted as signals NMP1, NMP2, . . . , NMPi, . . . from at least one other electronic control unit OECU installed on the chassis system and on the subsystems of the chassis system of the vehicle.

Optionally, the method 100 further comprises the following step:

update 105*b* is at least one of the new electronic control unit parameters NECUP into the vehicle chassis system simulation module VSM, to update the physics-based model of the vehicle chassis system simulation module VSM, and/or update 105*b* is via the communication bus (CB) at least one of other electronic control unit OECU configurable parameters based on predictions of the second neural network SNN.

According to another aspect, the invention relates to a computer program comprising a set of instructions executable on a computer or a processing unit, the set of instructions being configured to implement the method 100 according to anyone of the embodiments described hereinabove, when the instructions are executed by the computer or the processing unit.

According to a further aspect, the invention relates to a new electronic control unit NECU configured to communicate with a communication bus CB of a vehicle so as to collect signal data time series comprising measured sensor data MSD measured during a period of time by at least one sensor from a set S of sensors installed on the chassis system and on subsystems of the chassis system of a vehicle, the signal data optionally further comprising new model parameters NMP transmitted as signals NMP1, NMP2, . . . , NMPi, . . . from at least one other electronic control unit OECU installed on the chassis system and on the subsystems of the chassis system of the vehicle, the new electronic control unit NECU being configured to run a vehicle chassis system simulation module VSM based on a vehicle main physics-based model VMPM of the chassis system of the vehicle and on a physics-based model VSSPM1, VSSPM2, . . . , VSSPMi, . . . of each subsystem of the chassis system of the vehicle, a first neural network module FNN, the first neural network being preferably a recurrent neural network RNN, a second neural network module SNN, and a signal processing module SPM, the new electronic control unit NECU further comprising a processing unit and a memory unit, the memory unit comprising a computer program comprising a set of instructions executable on the computer or the processing unit, the set of instructions being configured to implement the method 100 according to anyone of the embodiments described hereinabove, when the instructions are executed by the computer or the processing unit.

According to a further aspect, the invention relates to a vehicle comprising a new electronic control unit NECU as set forth herein above.

The invention claimed is:

1. A method for monitoring health status of a chassis system of a vehicle, the chassis system comprising a plurality of subsystems of the chassis system of the vehicle, the vehicle comprising a new electronic control unit, a set of sensors, and a communication bus configured to convey signal data to the new electronic control unit, the new electronic control unit being configured to run a vehicle chassis system simulator based on a vehicle main physics-based model of the chassis system of the vehicle and based on a physics-based model of each subsystem of the chassis system of the vehicle, a first neural network, a second neural network, and a signal processor, the method comprising:

collect signal data, the signal data comprising measured sensor data measured by at least one sensor of the set of sensors during a period of time;

process, by the signal processor, the signal data, to produce processed signal data;

feed processed signal data as input to the first neural network, trained for predicting a first neural network output, the first neural network output comprising a first set of data-driven subsystem health statuses;

feed the signal data as input to the vehicle chassis system simulator, the vehicle chassis system simulator being configured to provide a vehicle chassis system simulation output based on the physics-based model of the vehicle chassis system and on the signal data, the vehicle chassis system simulation output comprising a second set of physics-based subsystem health statuses;

provide the first set of data-driven subsystem health statuses and the second set of physics-based subsystem health statuses as input to the second neural network, the second neural network being configured to provide a second neural network output, the second neural network output being a set of consolidated subsystem health statuses; and depending on the set of consolidated subsystem health statuses, produce a support recommendation to temporarily correct failures indicated by the set of consolidated subsystem health statuses and send the set of consolidated subsystem health statuses to a support center to plan future support actions to permanently correct the failures.

2. The method of claim 1, wherein the signal data collected at the step of collecting signal data further comprises new model parameters transmitted via the communication bus as signals from at least one other electronic control unit installed on the chassis system and on the subsystems of the chassis system of the vehicle.

3. The method of claim 2, wherein the new model parameters comprise any high frequency changing parameter that is used in another electronic unit, a high frequency changing parameter being a parameter the value of which changes within less than one second of time, or within less than 25 meters of vehicle travelling.

4. The method of claim 1, wherein the new electronic control unit is provided with new electronic control unit parameters, comprising configurable parameters embedded inside the new electronic control unit, which are entered into the physics-based vehicle chassis system simulator, either in the vehicle main physics-based model of the chassis system of the vehicle and/or in the physics-based model of any one of the subsystem of the chassis system of the vehicle, and wherein the at least one other electronic control unit is provided with other electronic control unit parameters comprising configurable parameters embedded inside the other electronic control unit comprising configurable parameters embedded inside the new electronic control unit, the method further comprising:

update at least one of the new electronic control unit parameters into the vehicle chassis system simulator, to update the physics-based model of the vehicle chassis system simulator, and/or update via the communication bus at least one of the other electronic control unit parameters based on predictions of the second neural network.

5. The method of claim 1, wherein the set of sensors comprises all the sensors installed on the chassis system and on the subsystems of the chassis system of the vehicle.

6. The method of claim 1, wherein the vehicle chassis system simulator comprises a truck main model corresponding to the vehicle main physics-based model, and further comprises a tires model, an engine and powertrain model, a valves model, a suspension and steering model, a brakes model, a truck geometry model, and a brake system model, corresponding to the physics-based model of each subsystem of the chassis system of the vehicle.

7. A new electronic control unit comprising:

a memory unit storing instructions; and a processor executing the instructions from the memory unit to:

communicate with a communication bus of a vehicle so as to collect signal data time series during a period of time, the signal data comprising measured sensor data measured during the period of time by at least one sensor of a set of sensors installed on a chassis system and on subsystems of the chassis system of the vehicle, the signal data further comprising new model parameters transmitted via the communication bus as signals from at least one other electronic control unit installed on the chassis system and on the subsystems of the chassis system of the vehicle, run a vehicle chassis system simulator based on a vehicle main physics-based model of the chassis system of the vehicle and on a physics-based model of each subsystem of the chassis system of the vehicle, run a first neural network run a second neural network, and a signal processor, and implement the method of claim 1.

8. A vehicle comprising the new electronic control unit of claim 7.

* * * * *